(12) United States Patent
Choi et al.

(10) Patent No.: US 11,804,841 B2
(45) Date of Patent: Oct. 31, 2023

(54) INTERFACE CIRCUIT AND OPERATING METHOD THEREOF TO COMPENSATE FOR SUPPLY VOLTAGE VARIATIONS

(71) Applicant: SAMSUNG ELECTRONICS CO., LTD., Suwon-si (KR)

(72) Inventors: Jaemin Choi, Suwon-si (KR); Yonghun Kim, Hwaseong-si (KR); Jinhyeok Baek, Busan (KR); Yoochang Sung, Hwaseong-si (KR); Changsik Yoo, Seoul (KR); Jeongdon Ihm, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/569,041

(22) Filed: Jan. 5, 2022

(65) Prior Publication Data

US 2022/0368328 A1    Nov. 17, 2022

(30) Foreign Application Priority Data

May 12, 2021 (KR) .................. 10-2021-0061648

(51) Int. Cl.
*H03K 19/003* (2006.01)
*G11C 7/22* (2006.01)
*G11C 5/14* (2006.01)
*H03K 19/0185* (2006.01)
*G11C 7/10* (2006.01)
*G11C 8/06* (2006.01)

(52) U.S. Cl.
CPC ....... *H03K 19/00384* (2013.01); *G11C 5/147* (2013.01); *G11C 7/22* (2013.01); *H03K 19/018521* (2013.01); *G11C 7/1057* (2013.01); *G11C 7/1084* (2013.01); *G11C 8/06* (2013.01)

(58) Field of Classification Search
CPC ....... H03K 19/00369; H03K 19/00376; H03K 19/00384; H03K 19/00346; H03K 19/00353; H03K 19/00361; H03K 19/018521; H03K 19/018528; H03K 19/00323; H03K 3/011; G11C 7/1084; G11C 7/1057; G11C 5/147; G11C 8/06
See application file for complete search history.

(56) References Cited

U.S. PATENT DOCUMENTS 5,805,012 A * 9/1998 Jeon ................. H03K 19/00384
                                                    327/543
7,262,637 B2    8/2007 Pan et al.
8,198,930 B2    6/2012 Zerbe et al.
(Continued)

FOREIGN PATENT DOCUMENTS

GB    2441161 A  *  2/2008  ....... H03K 19/00361
KR    10-1559501 B1    10/2015

*Primary Examiner* — Seokjin Kim
(74) *Attorney, Agent, or Firm* — Lee IP Law, P.C.

(57) ABSTRACT

An interface circuit includes: a buffer circuit configured to receive an input signal and to generate an output signal having a delay time, the delay time being determined based on a current level of a bias current and a voltage level of a power supply voltage; and a bias generation circuit configured to vary a voltage level of a bias control voltage so that the delay time is constant by compensating for a change in the voltage level of the power supply voltage, the bias generation circuit being further configured to provide the bias control voltage to the buffer circuit.

18 Claims, 18 Drawing Sheets

(56) References Cited

U.S. PATENT DOCUMENTS

| | | |
|---|---|---|
| 8,269,537 B2 | 9/2012 | Bae et al. |
| 8,976,875 B2 | 3/2015 | Lee |
| 9,565,036 B2 | 2/2017 | Zerbe et al. |
| 10,534,384 B2 | 1/2020 | Manlove et al. |
| 10,812,056 B1 * | 10/2020 | Wu ..................... H03K 3/0315 |
| 10,840,907 B1 * | 11/2020 | Werking ............ H03K 19/0013 |
| 11,418,170 B2 * | 8/2022 | Hong ............... H03K 19/00384 |
| 2006/0176096 A1 | 8/2006 | Dreps et al. |
| 2014/0009200 A1 | 1/2014 | Kay et al. |
| 2021/0384894 A1 * | 12/2021 | Hong ..................... H03K 3/012 |

* cited by examiner

INTERFACE CIRCUIT AND OPERATING METHOD THEREOF TO COMPENSATE FOR SUPPLY VOLTAGE VARIATIONS

CROSS-REFERENCE TO RELATED APPLICATION

This application is based on and claims priority under 35 U.S.C. § 119 to Korean Patent Application No. 10-2021-0061648, filed on May 12, 2021, in the Korean Intellectual Property Office, the disclosure of which is incorporated by reference herein in its entirety.

BACKGROUND

1. Field

Embodiments relate to an interface circuit and operating method thereof to compensate for supply voltage variations.

2. Description of the Related Art

With the development of multimedia, the degree of integration of semiconductor devices used in computers or mobile devices is increasing. As an example of a semiconductor device, memory devices including memory are increasing in capacity and speed, and various attempts have been made to include a larger capacity memory in a smaller semiconductor device and to operate the semiconductor device faster.

SUMMARY

Embodiments are directed to an interface circuit, including: a buffer circuit configured to receive an input signal and to generate an output signal having a delay time, the delay time being determined based on a current level of a bias current and a voltage level of a power supply voltage; and a bias generation circuit configured to vary a voltage level of a bias control voltage so that the delay time is constant by compensating for a change in the voltage level of the power supply voltage, the bias generation circuit being further configured to provide the bias control voltage to the buffer circuit.

Embodiments are directed to a semiconductor device, including: a buffer circuit configured to receive an input signal and to generate an output signal having a delay time, the delay time of the output signal being determined based on a current level of a bias current and a voltage level of a power supply voltage; and a bias generation circuit including a first resistor and a first transistor group that is connected in series with the first resistor, and configured to divide a bias supply voltage based on the first transistor group to determine a voltage level of a bias control voltage that controls the current level of the bias current, the bias generation circuit being further configured to provide the bias control voltage to the buffer circuit. The first transistor group may include: a first transistor that is connected in series with the first resistor, the first transistor having a gate to which the power supply voltage is applied; a second transistor that is connected in series with the first transistor, the second transistor having a gate to which the bias control voltage is applied; and a third transistor that is connected in series with the second transistor, the third transistor configured to receive a bias enable signal.

Embodiments are directed to a semiconductor device, including: a buffer circuit configured to receive an input signal and to generate an output signal having a delay time, the delay time of the output signal being determined based on a current level of a bias current and a voltage level of a power supply voltage, the buffer circuit including a plurality of buffers and a plurality of buffer transistors; and a bias generation circuit configured to determine a voltage level of a bias control voltage for controlling the current level of the bias current based on the voltage level of the power supply voltage, and to provide the bias control voltage to the buffer circuit. The bias generation circuit may include a variable resistor and a first transistor group that is connected in series with the variable resistor.

BRIEF DESCRIPTION OF THE DRAWINGS

Features will become apparent to those of skill in the art by describing in detail example embodiments with reference to the attached drawings in which.

DETAILED DESCRIPTION

Figure 1:
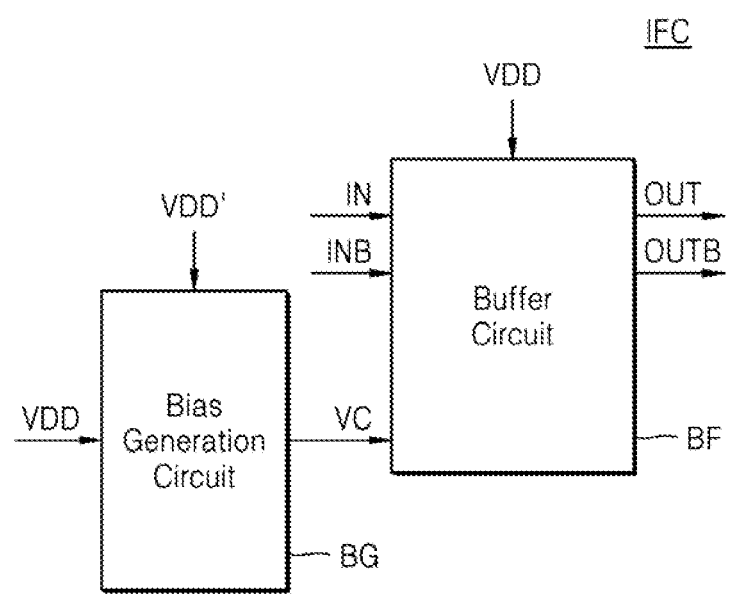
FIG. 1 is a block diagram of an interface circuit according to an example embodiment.

FIG. 1 is a block diagram illustrating an interface circuit according to an example embodiment. Specifically, the block diagram of FIG. 1 shows an interface circuit IFC included in a semiconductor device.

In an example embodiment, the semiconductor device may include a memory device and a non-memory device, and the memory device may be an embedded memory device. The memory device may include an interface circuit.

The interface circuit IFC may store data based on a command and an address provided from the outside of the interface circuit IFC. In an example embodiment, as described below with reference to FIG. 16, the interface circuit IFC may include components for writing data to or reading data from the memory device. The interface circuit IFC may include an address buffer, a data buffer, and a data input/output circuit.

Referring to FIG. 1, the interface circuit IFC may include a buffer circuit BF and a bias generation circuit BG.

A power supply voltage VDD may be applied to the buffer circuit BF. The buffer circuit BF may receive an input signal IN and an inverted input signal INB obtained by inverting the input signal IN, and generate an output signal OUT and an inverted output signal OUTB obtained by inverting the output signal OUT.

The output signal OUT and the inverted output signal OUTB may have a delay time. The delay time may vary depending on the power supply voltage VDD. For example, as the power supply voltage VDD increases, the delay time of the output signal OUT may decrease, and as the power supply voltage VDD decreases, the delay time of the output signal OUT may increase.

The bias generation circuit BG may be connected to the buffer circuit BF. The power supply voltage VDD may be applied to the bias generation circuit BG. By compensating for a voltage level change of the power supply voltage VDD, the bias generation circuit BG may vary the voltage level of the bias control voltage VC such that the delay times of the output signal OUT and the inverted output signal OUTB of the buffer circuit BF are constant. The bias generation circuit BG may provide the bias control voltage VC to the buffer circuit BF. A bias supply voltage VDD' may be applied to the bias generation circuit BG. The bias generation circuit BG may generate the bias control voltage VC using the bias supply voltage VDD'.

According to the present example embodiment, an interface circuit IFC that generates an output signal OUT having a constant delay time may be provided. Accordingly, noise of a signal may be removed, and a sensing characteristic of an interface circuit may be improved.

Hereinafter, interface circuits of various example embodiments will be described.

Figure 2:
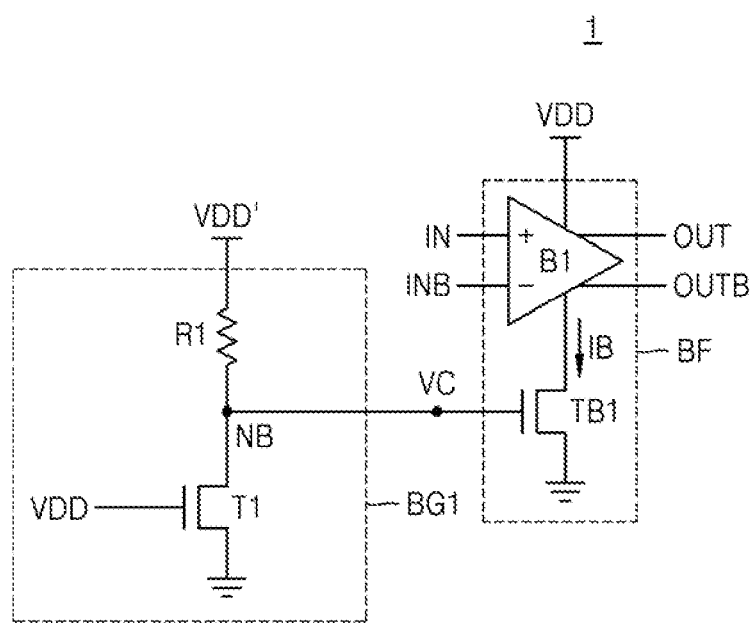
FIG. 2 is a circuit diagram of an interface circuit according to an example embodiment.

FIG. 2 is a circuit diagram illustrating an interface circuit according to an example embodiment. Specifically, an interface circuit 1 of FIG. 2 shows an example embodiment of the interface circuit IFC of FIG. 1. Accordingly, description is given also with reference to FIG. 1.

Referring to FIG. 2, the interface circuit 1 may include a buffer circuit BF and a bias generation circuit BG1.

The buffer circuit BF may receive an input signal IN and an inverted input signal INB obtained by inverting the input signal IN, and generate an output signal OUT having a delay time determined based on a current level of a bias current D3 and a voltage level of the power supply voltage VDD, and an inverted output signal OUTB obtained by inverting the output signal OUT. The input signal IN may be a signal received from the outside of the integrated circuit including the interface circuit. The buffer circuit BF may receive a reference signal having a constant signal level instead of the inverted input signal INB.

The buffer circuit BF may include a first buffer B1 and a first buffer transistor TB1. In the present example embodiment, one first buffer B1 and one buffer transistor TB1 are shown, but the buffer circuit BF may include a plurality of buffers and a plurality of buffer transistors. When the buffer circuit BF includes a plurality of buffers and a plurality of buffer transistors, the plurality of buffers may be connected to each other. A case in which the buffer circuit BF includes a plurality of buffers and buffer transistors will be described in detail with reference to FIG. 9.

The first buffer B1 may be an analog buffer. A power supply voltage VDD may be applied to the first buffer B1. The first buffer B1 may receive an input signal IN and an inverted input signal INB obtained by inverting the input signal IN, and output an output signal OUT and an inverted output signal OUTB. The inverted output signal OUTB is a signal complementary to the output signal OUT and is output together with the output signal OUT, but is omitted for convenience of description below.

The first buffer B1 may generate an output signal OUT having a delay time. The delay time may vary depending on the power supply voltage VDD. For example, as the power supply voltage VDD increases, the delay time of the output signal OUT may decrease, and as the power supply voltage VDD decreases, the delay time of the output signal OUT may increase. The first buffer B1 amplifies the signal level difference between the input signal IN and the inverted input signal INB based on the bias current D3 discharged through the current path so that an output signal OUT and an inverted output signal OUTB may be generated. Accordingly, as the bias current D3 increases, the delay time of the output signal OUT may decrease, and as the bias current D3 decreases, the delay time of the output signal OUT may increase.

The first buffer transistor TB1 may correspond to the first buffer B1. The first buffer transistor TB1 may provide a current path to the first buffer B1. A bias current D3 may flow through the first buffer transistor TB1. The current level of the bias current D3 may be controlled according to the voltage level of the voltage input to the gate of the first buffer transistor TB1. For example, when the voltage input to the gate of the first buffer transistor TB1 increases, the bias current D3 may increase.

The transistors may have any suitable structures. For example, the transistors may include a fin field effect transistor (FinFET) formed by an active pattern extending in a fin shape and a gate electrode. The transistors may include a multi-bridge channel FET (MBCFET) formed by a plurality of nanosheets extending parallel to each other and a gate electrode. Transistors may include a ForkFET in which an N-type transistor and a P-type transistor have a more proximate structure as separating the nanosheets for the P-type transistor and the nanosheets for the N-type transistor by a dielectric wall. In addition to a field effect transistor (FET) such as a complementary FET (CFET), a negative FET (NCFET), a carbon nanotube (CNT) FET, and the like, transistors may include bipolar junction transistors and other three-dimensional transistors. The first buffer transistor TB1 may be an N-type transistor or a P-type transistor. In the present example embodiment, the first buffer transistor TB1 is illustrated as an N-type transistor, but may be configured in various other ways.

In the present example embodiment, the drain of the first buffer transistor TB1 is connected to the first buffer B1, the source of the first buffer transistor TB1 is connected to the ground terminal, and the gate of the first buffer transistor TB1 is connected to the bias generation circuit BG1 (described further below) through the bias node NB.

The bias generation circuit BG1 may be connected to the buffer circuit BF through the bias node NB. The bias generation circuit BG1 may determine the voltage level of the bias control voltage VC for controlling the current level of the bias current D3 based on the voltage level of the power supply voltage VDD, and provide the bias control voltage VC to the buffer circuit BF. The bias control voltage VC may be applied to the gate of the first buffer transistor TB1.

A bias supply voltage VDD' may be applied to the bias generation circuit BG1. The bias generation circuit BG1 may generate the bias control voltage VC using the bias supply voltage VDD'. For example, the bias generation circuit BG1 may generate the bias control voltage VC by dividing the bias supply voltage VDD'. Accordingly, the bias supply voltage VDD' may have a higher voltage level than the bias control voltage VC. The voltage level of the bias supply voltage VDD' may be the same as or different from the voltage level of the power supply voltage VDD. For example, the voltage level of the bias supply voltage VDD' may be greater than the voltage level of the power supply voltage VDD.

The bias generation circuit BG1 may include a first resistor R1 and a first transistor T1. One end of the first resistor R1 may be connected to the bias node NB, and the bias supply voltage VDD' may be applied to the other end of the first resistor R1. The resistance value of the first resistor R1 may be predetermined according to a delay time of the output signal OUT and the power supply voltage VDD of the first buffer B1. For example, when the delay time of the output signal OUT is relatively long, the first resistor R1 may have a relatively small resistance value.

The first transistor T1 may be connected in series with the first resistor R1. One end of the first transistor T1 may be connected to the first resistor R1, and the ground voltage may be applied to the other end of the first transistor T1. Thus, the first resistor R1 and the first transistor T1 may share the bias node NB. The power supply voltage VDD may be applied to the gate of the first transistor T1. The power supply voltage VDD applied to the first transistor T1 may be at the same voltage level as the power supply voltage VDD applied to the first buffer B1. A resistance value RT1 of the first transistor T1 may be changed in real time according to the voltage level of the power supply voltage VDD. For example, as the voltage level of the power supply voltage VDD applied to the gate of the first transistor T1 increases, the resistance value RT1 of the first transistor T1 may decrease. Thus, by applying the power supply voltage VDD to the gate of the first transistor T1, the voltage level of the bias control voltage VC may be controlled based on the voltage level of the power supply voltage VDD. Accordingly, the current level of the bias current IB may be controlled.

For example, when the power supply voltage VDD has a relatively low voltage level, the delay time of the output signal OUT by the power supply voltage VDD may be relatively long. In addition, when the power supply voltage VDD having a relatively low voltage level is applied to the gate of the first transistor T1, the resistance value RT1 of the first transistor T1 may increase. The bias supply voltage VDD' may be divided based on the resistance value of the first resistor R1 connected in series and the resistance value RT1 of the first transistor T1. A voltage obtained by dividing the bias supply voltage VDD' to the first transistor T1 may be provided to the buffer circuit BF as the bias control voltage VC.

The bias control voltage VC may be calculated as in [Equation 1].

$$VC = \frac{RT1}{R1 + RT1} VDD' \qquad \text{[Equation 1]}$$

In Equation 1, RT1 is the resistance value of the first transistor T1. VC is the voltage level of the bias control voltage. R1 is the resistance value of the first resistor R1. VDD' is the bias supply voltage.

According to Equation 1, as the resistance value RT1 of the first transistor T1 increases, the voltage level of the bias control voltage VC increases. Accordingly, the bias control voltage VC having a high voltage level may be provided to the first buffer transistor TB1. Because the bias control voltage VC having a high voltage level is applied to the gate of the first buffer transistor TB1, a current level of the bias current D3 may increase, and a delay time of the output signal OUT of the first buffer B1 may decrease. Thus, the delay time that is increased by the power supply voltage VDD connected to the buffer B1 is compensated by the delay time that is decreased by the bias generation circuit BG1, so that an output signal OUT having a constant delay time may be generated.

In other words, the delay time of the output signal OUT of the first buffer B1 may be controlled by controlling the bias current D3 flowing through the first buffer transistor TB1. The delay time controllable by the bias generation circuit BG1 may increase as the current level of the bias current IB increases. Therefore, the delay time caused by the power supply voltage VDD connected to the buffer B1 is compensated by the delay time generated by the bias generation circuit BG1, so that an output signal OUT having a constant delay time may be provided.

According to the present example embodiment, the interface circuit 1 for generating the output signal OUT having a constant delay time may be provided. Accordingly, noise of a signal may be removed, and a sensing characteristic of an interface circuit may be improved. These effects will now be described in detail with reference to FIGS. 3A-B and 4.

Figure 3A:
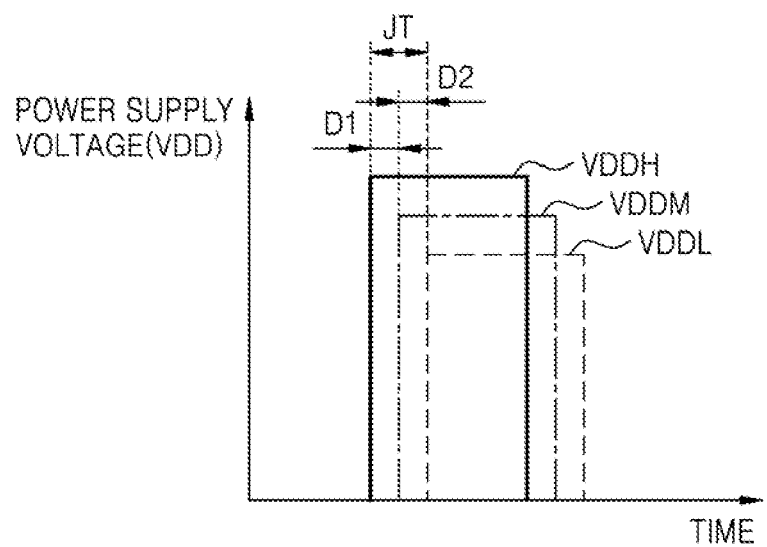
FIGS. 3A and 3B are graphs illustrating a jitter reduction effect of an interface circuit according to an example embodiment.
Figure 3B:
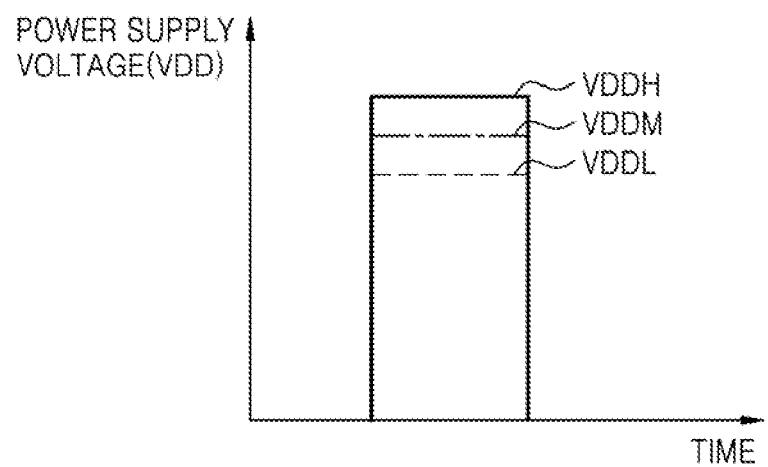

FIGS. 3A and 3B are graphs illustrating a jitter reduction effect of an interface circuit according to an example embodiment. Specifically, FIG. 3A shows signals of a comparative interface circuit that does not include the bias generation circuit BG1, and FIG. 3B shows signals of an example embodiment in which the interface circuit includes the bias generation circuit BG1.

FIG. 3A illustrates delay times of an output signal. The output signal may include an analog signal, data, a clock signal, and the like.

Referring to FIG. 3A, for the comparative interface circuit not including the bias generation circuit BG1, output signals may include different delay times according to the voltage level of the power supply voltage VDD. For example, when a high level power supply voltage VDDH is applied to the first buffer B1, an output signal having a first delay time may be generated. When an intermediate level power supply voltage VDDM is applied to the first buffer B1, an output signal having a second delay time may be generated. When a low level power supply voltage VDDL is applied to the first buffer B1, an output signal having a third delay time may be generated. The first delay time may be shorter than the second delay time by a first time D1, and the third delay time may be longer than the second delay time by a second time D2.

As described above, in the comparative interface circuit of FIG. 3A, output signals having different delay times may be generated according to the level of the power supply voltage VDD. The difference in delay time may be referred to as 'jitter JT'. When jitter JT occurs as shown in FIG. 3A, a time margin for accurately detecting a signal may be reduced. Also, the jitter JT may act as noise, and thus, the sensing characteristic of the interface circuit may be deteriorated.

In contrast, referring to FIGS. 2 and 3B, the interface circuit 1 including the bias generation circuit BG1 may generate an output signal having a same, e.g., constant, delay time even if the voltage level of the power supply voltage VDD is changed. For example, when a relatively high level of power supply voltage VDDH is applied to the first buffer B1, when a medium level power supply voltage VDDM is applied to the first buffer B1, and when a relatively low level of power supply voltage VDDL is applied to the first buffer B1, all output signals with the same delay time may be generated. Because there is no difference in delay time, 'jitter JT' may be improved. Accordingly, a time margin for accurately detecting a signal is increased, and noise of a signal is reduced, so that the sensing characteristic of the interface circuit may be improved. Even when the voltage level of the power supply voltage is an analog signal that changes with time (in addition to digital signals such as clock signals), the present example embodiment may provide a constant delay time.

Figure 4:
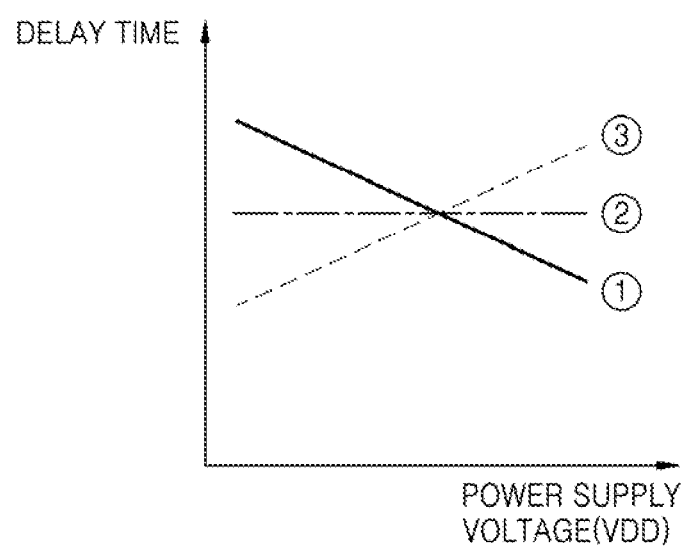
FIG. 4 is a graph for explaining an operation of an interface circuit according to an example embodiment.

FIG. 4 is a graph illustrating an operation of an interface circuit according to an example embodiment. Specifically, FIG. 4 shows the operation of the interface circuit 1 of FIG. 2, and the delay time Delay according to the voltage level of the power supply voltage VDD of the first buffer B1.

Referring to FIGS. 2 and 4, the first graph ① may represent a delay time generated according to the power supply voltage VDD of the first buffer B1. The first graph ① may be a characteristic of the first buffer B1. The delay time generated by the power supply voltage VDD of the first buffer B1 may decrease as the power supply voltage VDD increases, as shown in the first graph ①. Accordingly, when the power supply voltage VDD having a relatively high level is applied to the buffer B1, the delay time generated by the power supply voltage VDD may be relatively reduced.

The second graph ② is an ideal case, and a delay time generated according to the power supply voltage VDD of the first buffer B1 may be constant. Thus, even when the power supply voltage VDD changes, the delay time of the output signal OUT may be constant.

The third graph ③ represents the delay time compensated by the bias generator BG1. The third graph ③ may represent a delay time provided by controlling the bias control voltage VC based on the voltage level of the power supply voltage VDD. The delay time compensated by the bias generation circuit BG1 may increase as the power supply voltage VDD increases.

In the present example embodiment, when a power supply voltage VDD having a relatively high level is applied to the first buffer B1, the power supply voltage VDD having a relatively high level is also applied to the first transistor T1, and as the resistance value of the first transistor T1 decreases, the bias control voltage VC may decrease. As the bias control voltage VC decreases, the current level of the bias current D3 flowing through the first buffer transistor TB1 may decrease, and an output signal having a relatively increased delay time may be provided. Therefore, the delay time generated by the power supply voltage VDD of the first buffer B1 is reduced, and the delay time generated by the bias generation circuit BG1 increases, so that the difference in delay time may be compensated to have a constant delay time.

In other words, the delay time change caused by the characteristics of the first buffer B1 represented by the first graph ① is compensated by the delay time change caused by the bias generation circuit represented by the third graph ③ so that, as shown in the second graph ②, an output signal having a constant delay time may be generated. For example, if the delay time generated by the characteristic of the first buffer B1 is decreased, the delay time generated by the bias generation circuit may be increased to provide an output signal having a constant delay time.

Figure 5:
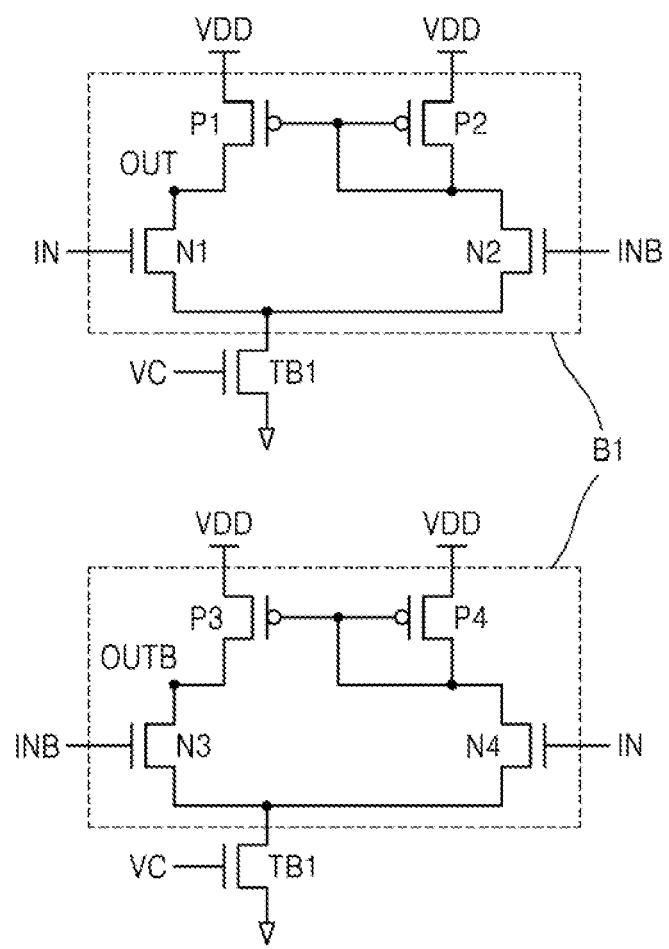
FIG. 5 is a circuit diagram of a buffer according to an example embodiment.

FIG. 5 is a circuit diagram of a buffer according to an example embodiment. Specifically, FIG. 5 shows a circuit diagram of the first buffer B1 of FIG. 2.

Referring to FIGS. 2 and 5, the first buffer B1 may include first to fourth N-type transistors N1 to N4 and first to fourth P-type transistors P1 to P4.

The first and second P-type transistors P1 and P2 may each have a power supply voltage VDD applied to a source terminal thereof, and may share a gate terminal with each other. A drain terminal of the first P-type transistor P1 may be connected to a drain terminal of the first N-type transistor N1. The drain terminal of the second P-type transistor P2 may be connected to the drain terminal of the second N-type transistor N2 and may be connected to the gate terminals of the first and second P-type transistors P1 and P2 to supply a voltage. The input signal IN may be applied to the gate terminal of the first N-type transistor N1, and the inverted input signal INB obtained by inverting the input signal IN may be applied to the gate terminal of the second N-type transistor N2. Sources of the first and second N-type transistors N1 and N2 may be connected to the first buffer transistor TB1.

The third and fourth P-type transistors P3 and P4 may each have the power supply voltage VDD applied to a source terminal thereof, and may share a gate terminal with each other. A drain terminal of the third P-type transistor P3 may be connected to a drain terminal of the third N-type transistor N3. The drain terminal of the fourth P-type transistor P4 may be connected to the drain terminal of the fourth N-type transistor N4, and may be connected to the gate terminals of the third and fourth P-type transistors P3 and P4 to supply a voltage. The inverted input signal INB obtained by inverting the input signal IN may be applied to a gate terminal of the third N-type transistor N3, and the input signal IN may be applied to a gate terminal of the fourth N-type transistor N4. Sources of the third and fourth N-type transistors N3 and N4 may be connected to the first buffer transistor TB1.

The output signal OUT may be output from the drain terminal of the first P-type transistor P1, and the inverted output signal OUTB obtained by inverting the output signal may be output from the drain terminal of the third P-type transistor P3.

The present example embodiment is merely an example, and the first buffer B1 of FIG. 2 may be implemented in various ways.

Figure 6:
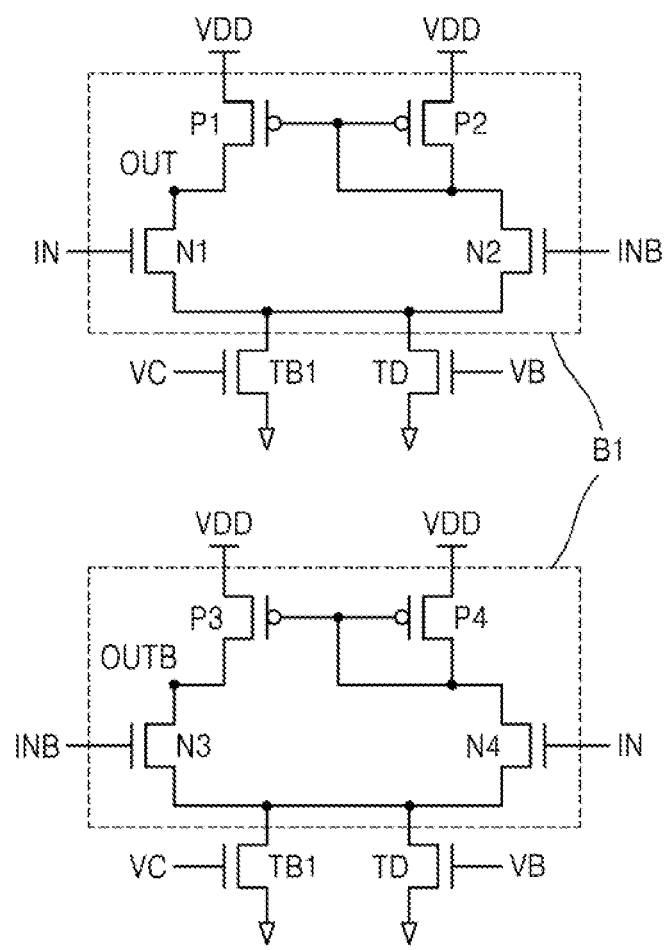
FIG. 6 is a circuit diagram of a buffer according to an example embodiment.

FIG. 6 is a circuit diagram of a buffer according to an example embodiment. Specifically, FIG. 6 shows another example embodiment of FIG. 5.

Referring to FIG. 6, the first buffer B1 may further include a fixed bias transistor TD. The fixed bias transistor TD may generate a constant bias current and provide the generated constant bias current to the buffer B1. A fixed bias control voltage VB may be applied to the gate of the fixed bias transistor TD. The fixed bias control voltage VB may have a different voltage level from the bias control voltage VC applied to the gate of the first buffer transistor TB1. However, the present invention is not limited thereto, and in an embodiment, the fixed bias control voltage VB may have the same voltage level as the bias control voltage VC.

The fixed bias transistor TD may be connected to the source terminals of the first to fourth N-type transistors N1 to N4. Accordingly, the first to fourth N-type transistors N1 to N4 may generate a bias current by simultaneously using the first buffer transistor T1 and the fixed bias transistor TD. A variable bias current is generated based on the power supply voltage VDD by the first buffer transistor T1 and a constant bias current is generated by the fixed bias transistor TD so that a stable current may be supplied to the buffer B1. The first buffer transistor T1 and the fixed bias transistor TD may be used in various ways.

Figure 7:
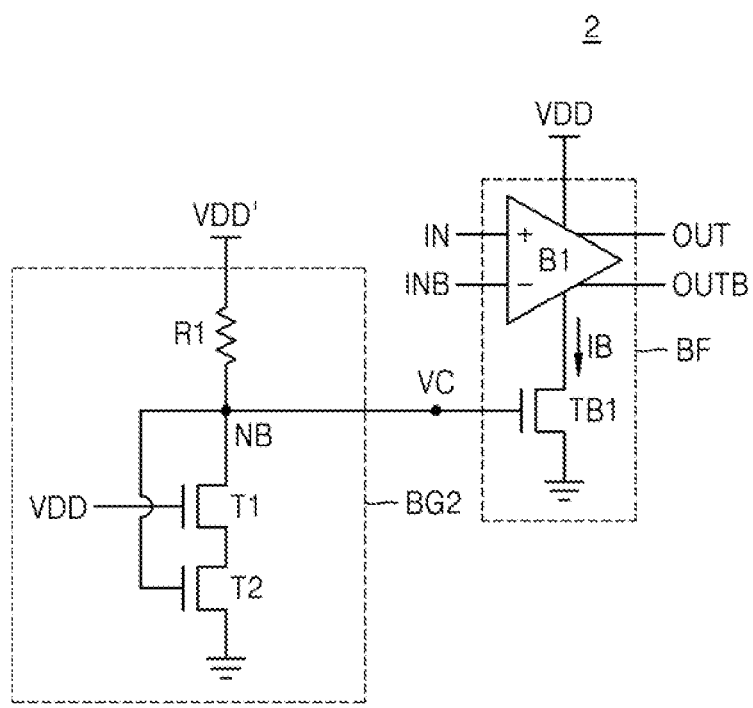
FIG. 7 is a circuit diagram of an interface circuit according to an example embodiment.

FIG. 7 is a circuit diagram of an interface circuit according to an example embodiment. Specifically, FIG. 7 shows another example embodiment of FIG. 2, and may further include a second transistor in a bias generation circuit BG2.

Referring to FIG. 7, an interface circuit 2 may further include a second transistor T2 in the bias generation circuit BG2. One end of the second transistor T2 may be connected to the first transistor T1, and the other end of the second transistor T2 may be connected to a ground terminal. A bias control voltage VC may be applied to the gate of the second transistor T2.

The second transistor T2 operates by receiving, as feedback, the bias control voltage VC that changes according to the power supply voltage VDD applied to the gate of the first transistor T1, thereby stably operating the bias generation circuit BG2. As the bias control voltage VC is input to the gate of the second transistor T2, the second transistor T2 may prevent the first transistor T1 from being short-circuited or opened.

For example, when a power supply voltage VDD having a very low voltage level is applied to the gate of the first transistor T1, the resistance value of the first transistor T1 increases, so that the bias control voltage VC may increase the voltage level. The bias control voltage VC having an increased voltage level may be fed back to the gate of the second transistor T2. Accordingly, the drain voltage of the second transistor T2 may decrease and the source voltage of the first transistor T1 may decrease. As the source voltage of the first transistor T1 decreases, because the potential difference between the gate and the source of the first transistor T1 increases, more current may flow through the first transistor T1, so that even if a very small power supply voltage VDD is applied, the first transistor T1 may be turned on to operate. The very small power supply voltage VDD described above may mean a voltage having a voltage level close to the voltage level of the ground voltage. As such, the second transistor T2 may feed back the bias control voltage VC so that the first transistor T1 may stably operate.

Figure 8:
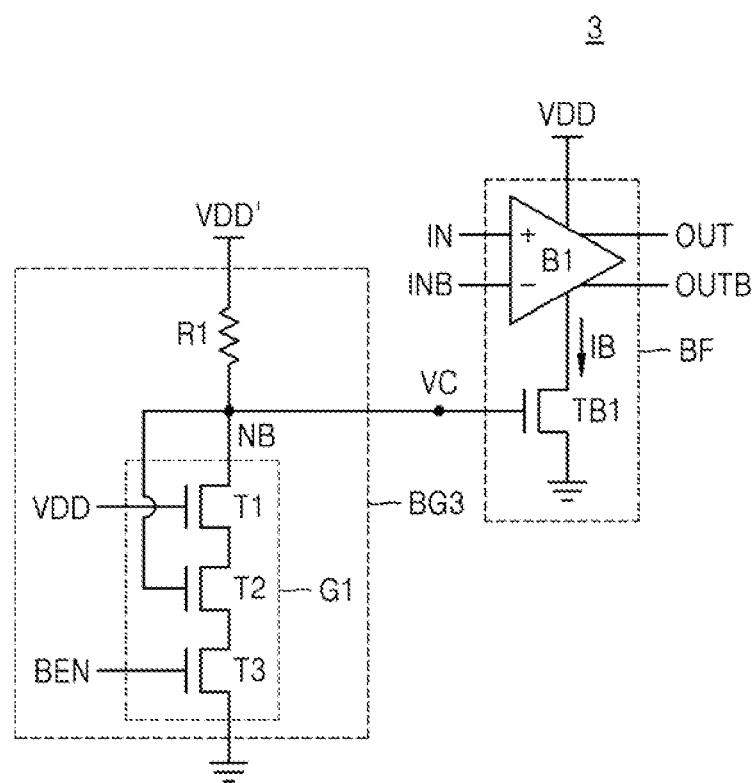
FIG. 8 is a circuit diagram of an interface circuit according to an example embodiment.

FIG. 8 is a circuit diagram of an interface circuit according to an example embodiment. Specifically, FIG. 8 is a circuit diagram illustrating another example embodiment of FIG. 2.

Referring to FIG. 8, a bias generation circuit BG3 of an interface circuit 3 may include the second transistor T2 and a third transistor T3. The first to third transistors T1 to T3 may constitute a first transistor group G1.

One end of the second transistor T2 may be connected to the first transistor T1, and the other end may be connected to the third transistor T3. A bias control voltage VC may be applied to the gate of the second transistor T2. One end of the third transistor T3 may be connected to the second transistor T2, and the other end may be connected to a ground terminal. The third transistor T3 may receive a bias enable signal BEN through the gate thereof.

The third transistor T3 may determine whether the bias generation circuit BG3 operates. For example, when the bias enable signal BEN is a high level signal, the bias generation circuit BG3 may operate. Accordingly, the bias control voltage VC may be determined by dividing the bias supply voltage VDD', and the determined bias control voltage VC may be provided to the buffer circuit BF. When the bias enable signal BEN is a low level signal, the bias generation circuit BG3 may not operate. Thus, the third transistor T3 may operate as a switch that operates the bias generation circuit BG3.

According to various example embodiments, a circuit including at least one of the second transistor T2 and the third transistor T3 may be implemented. For example, a circuit in which the second transistor T2 is omitted may be implemented. In this case, one end of the third transistor T3 may be connected to the first transistor T1, and the other end may be connected to the ground terminal.

Figure 9:
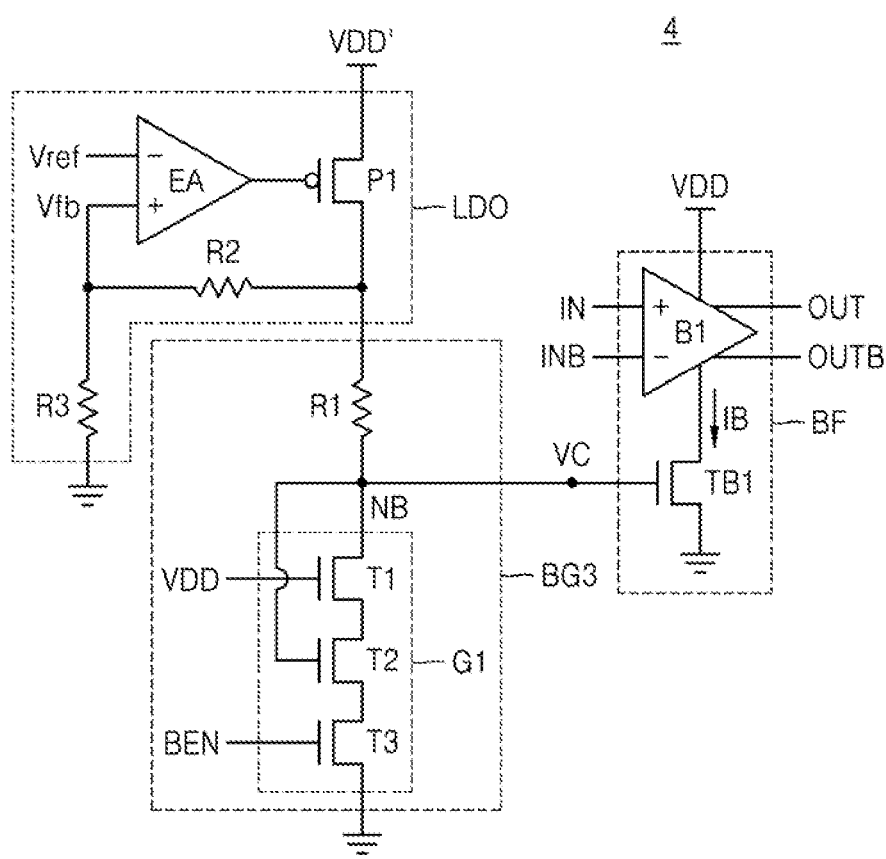
FIG. 9 is a circuit diagram of an interface circuit according to an example embodiment.

FIG. 9 is a circuit diagram of an interface circuit according to an example embodiment. Specifically, FIG. 9 is a circuit diagram illustrating another example embodiment of FIG. 2.

Referring to FIG. 9, an interface circuit 4 may further include a low dropout (LDO) circuit LDO. A bias supply voltage VDD' may be provided to a bias generation circuit BG3 through the LDO circuit LDO. The LDO circuit LDO may include an error amplifier EA, a pass transistor P1, a second resistor R2, and a third resistor R3.

The error amplifier EA may include two input terminals and one output terminal. A reference voltage Vref and a feedback voltage Vfb may be applied to the two input terminals of the error amplifier EA, respectively. The output terminal may be connected to the gate of the pass transistor P1. The error amplifier EA may compare the reference voltage Vref to the feedback voltage Vfb to adjust the pass transistor P1 so that a voltage difference does not occur. Accordingly, a stable bias supply voltage VDD' may be provided to the bias generation circuit BG3.

The bias supply voltage VDD' may be applied to one end of the pass transistor P1, and the other end of the pass transistor P1 may be connected in series with the first resistor R1 of the bias generation circuit BG3. A gate of the pass transistor P1 may be connected to the output terminal of the error amplifier EA. One end of the second resistor R2 may be connected to the pass transistor P1, and the other end may be connected to a feedback terminal supplying the feedback voltage Vfb to the error amplifier EA. One end of the third resistor R3 may be connected to the feedback terminal of the error amplifier EA, and the other end may be connected to a ground terminal.

The bias supply voltage provided to the bias generation circuit BG3 through the LDO circuit LDO may have a lower voltage level than the bias supply voltage VDD' applied to one end of the pass transistor P1. Even when the bias supply voltage VDD' applied to one end of the pass transistor P1 is not constant, the bias supply voltage provided to the bias generation circuit BG3 through the LDO circuit LDO may be maintained constant. Thus, even when the bias supply voltage VDD' is changed, the voltage output to the bias generation circuit BG3 may have a constant level. Accordingly, the bias control voltage VC provided to the buffer circuit BF may be stably provided using the bias generation circuit BG3.

Figure 10:
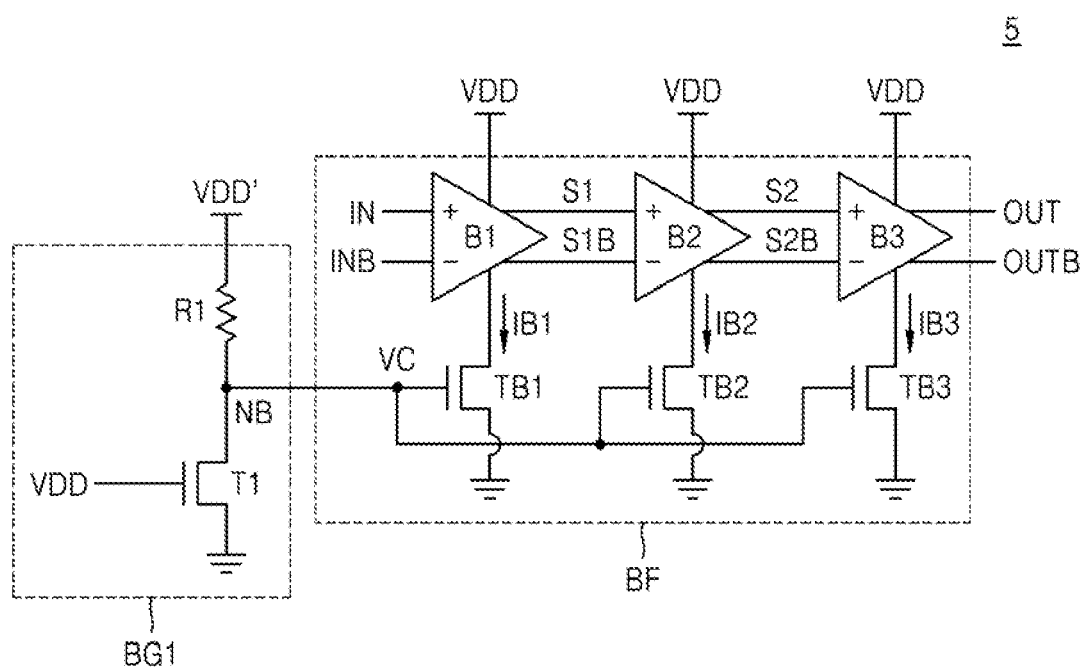
FIG. 10 is a circuit diagram of an interface circuit according to an example embodiment.

FIG. 10 is a circuit diagram of an interface circuit according to an example embodiment. Specifically, FIG. 10 is another example embodiment of FIG. 2, and may include a plurality of buffers and a plurality of buffer transistors.

In FIG. 10, the plurality of buffers B1 to B3 and the plurality of buffer transistors TB1 to TB3 are illustrated as three, but this is for convenience of description and is not limited thereto.

Referring to FIG. 10, a buffer circuit BF of an interface circuit 5 may include a plurality of buffers B1 to B3 and a plurality of buffer transistors TB1 to TB3.

The plurality of buffers B1 to B3 may correspond to the plurality of buffer transistors TB1 to TB3, respectively. For example, the first buffer B1 may correspond to the first buffer transistor TB1, and the second buffer B2 may correspond to the second buffer transistor TB2.

The plurality of buffers B1 to B3 may be analog buffers. A power supply voltage VDD may be applied to each of the plurality of buffers B1 to B3. The plurality of buffers B1 to B3 may be connected to each other. For example, the first buffer B1 may receive the input signal IN and the inverted input signal INB obtained by inverting the input signal IN, and output a first output signal S1 and a signal S1B obtained by inverting the first output signal S1. The second buffer B2 may receive a first output signal S1 and the inverted signal S1B obtained by inverting the first output signal S1, and output a second output signal S2 and an inverted signal S2B obtained by inverting the second output signal S2. The third buffer B3 may receive a second output signal S2 and a signal S2B obtained by inverting the second output signal S2 and output an output signal OUT and an inverted output signal OUTB obtained by inverting the output signal OUT.

The plurality of buffer transistors TB1 to TB3 may provide current paths to the plurality of buffers B1 to B3 corresponding thereto, respectively. One of the ends of the plurality of buffer transistors TB1 to TB3 may be connected to a plurality of buffers B1 to B3, respectively, and the other ends of the plurality of buffer transistors TB1 to TB3 may be connected to a ground terminal. Gates of the plurality of buffer transistors TB1 to TB3 may be connected to a bias generation circuit BG1. Accordingly, the bias control voltage VC may be applied to the gate of each of the plurality of buffer transistors TB1 to TB3.

In the present example embodiment, the bias generation circuit BG1 shown in FIG. 2 is illustrated, but the interface circuit 5 may include the bias generation circuits BG2 and BG3 illustrated in FIGS. 7 to 8, and may further include the LDO circuit LDO illustrated in FIG. 9.

In another example embodiment, at least one of the plurality of buffer transistors TB1 to TB3 may be configured to be connected to the bias generation circuit BG1. Thus, some of the plurality of buffer transistors TB1 to TB3 may be connected to the bias generation circuit BG1, and the rest may be connected to a circuit providing a fixed bias current. For example, the first buffer transistor TB1 may be connected to a circuit providing a fixed bias current to provide a current having a constant current level to the first buffer B1, and the second buffer transistor TB2 and the third buffer transistor TB3 may be connected to the bias generation circuit BG1 to provide a bias current with a variable current level to the second buffer B2 and the third buffer B3.

In another example embodiment, the plurality of buffer transistors TB1 to TB3 may be respectively connected to the plurality of bias generation circuits BG1. For example, the first buffer transistor TB1 may be connected to the first bias generation circuit having the same configuration as the bias generation circuit BG1, and the second buffer transistor TB1 may be connected to a second bias generation circuit having the same configuration as the bias generation circuit BG1, and the third buffer transistor TB3 may be connected to a third bias generation circuit having the same configuration as the bias generation circuit BG1.

In another example embodiment, some of the plurality of buffer transistors TB1 to TB3 may share the bias generation circuit BG1 so that the same bias control voltage VC may be applied, and the rest may be connected to other bias generation circuits each having the same configuration as the bias generation circuit BG1.

As described above, the interface circuit 5 may be configured in various ways.

Figure 11:
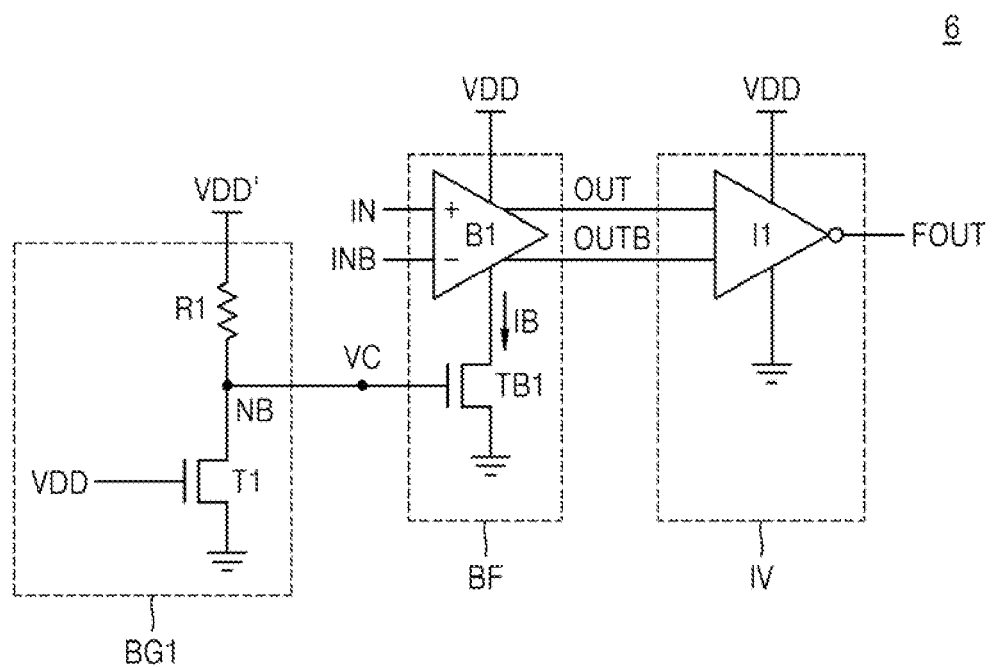
FIG. 11 is a circuit diagram of an interface circuit according to an example embodiment.

FIG. 11 is a circuit diagram of an interface circuit according to an example embodiment. Specifically, FIG. 11 is another example embodiment of FIG. 2.

In FIG. 11, an interface circuit 6 including the bias generation circuit BG1 shown in FIG. 2 is illustrated, but the interface circuit 6 may include the bias generation circuits BG2 and BG3 illustrated in FIGS. 7 to 8, and may further include the LDO circuit LDO illustrated in FIG. 9. In addition, as shown in FIG. 10, a plurality of buffers and a plurality of buffer transistors may be included, and at least one of the plurality of buffer transistors may be connected to a bias generation circuit.

Referring to FIG. 11, the interface circuit 6 may further include an inverter unit IV. The inverter unit IV may include a first inverter I1. Although only the first inverter I1 is illustrated for convenience of description, the inverter unit IV may include a plurality of inverters connected to each other.

A power supply voltage VDD may be applied to the first inverter I1. In another example embodiment, the power supply voltage VDD applied to the first inverter I1 may have a voltage level different from the power supply voltage applied to the first buffer B1.

The first inverter I1 may receive the output signal OUT of the first buffer B1 included in the buffer circuit BF and the inverted output signal OUTB obtained by inverting the output signal OUT to output a final output signal FOUT having a delay time. The delay time of the final output signal FOUT may be due to the characteristics of the first inverter I1. For example, the delay time of the final output signal FOUT may increase as the number of inverters included in the inverter unit IV increases.

In the present example embodiment, the delay time generated by the buffer circuit BF and the delay time generated by the inverter unit IV may be compensated by using the bias generation circuit BG1. For example, when a power supply voltage VDD having a low level is applied to the first buffer B1, the delay time generated by the first buffer B1 may increase by a first time, and due to the characteristics of the first inverter I1, the delay time of the final output signal FOUT may increase by a second time. The bias supply voltage VDD' may be divided based on the first time and the second time using the bias generation circuit BG1. The divided bias supply voltage VDD' may be provided to the buffer circuit BF as a bias control voltage VC. In this case, the bias control voltage VC may be a voltage capable of reducing the delay time by a third time, which is the sum of the first time and the second time. For example, the third time may be controlled by a method such as changing the resistance value of the first resistor R1, adjusting the voltage level of the bias supply voltage VDD', adding the second transistor T2 of FIG. 7, and the like. Thus, the bias control voltage VC capable of compensating for the delay time generated by the buffer circuit BF and the delay time generated by the inverter unit IV may be generated using the bias generation circuit BG1, and by providing the bias control voltage VC to the buffer circuit BF, a final output signal FOUT having a constant delay time may be provided.

Referring again to FIG. 4, the sum of delay times generated by the buffer circuit BF and the inverter unit IV may have the same tendency as in the first graph ①. By calculating this, a delay time having the same tendency as in the third graph ③ may be provided to the buffer circuit BF by the bias generation circuit BG1. Accordingly, the inverter unit IV may output the final output signal FOUT having a constant delay time as shown in the second graph ②.

Figure 12:
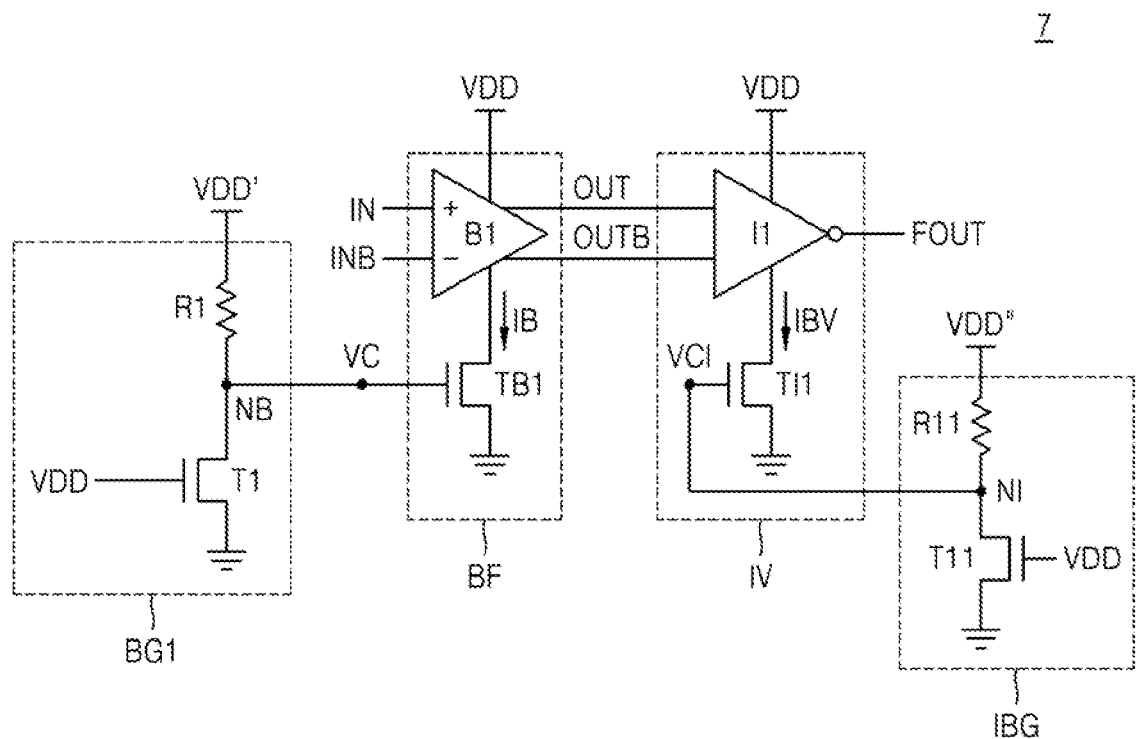
FIG. 12 is a circuit diagram of an interface circuit according to an example embodiment.

FIG. 12 is a circuit diagram of an interface circuit according to an example embodiment. Specifically, FIG. 12 is another example embodiment of FIG. 11.

Referring to FIG. 12, the inverter unit IV of an interface circuit 7 may further include a first inverter transistor TI1 and an inverter bias generation circuit IBG.

The first inverter transistor TI1 may correspond to the first inverter I1. The first inverter transistor TI1 may provide a current path to the first inverter I1. One end of the first inverter transistor TI1 may be connected to the first inverter I1, and the other end may be connected to a ground terminal. An inverter bias current IBV may flow through the first inverter transistor TI1. The current level of the inverter bias current IBV may be controlled according to the voltage level of the voltage input to the gate of the first inverter transistor TI1. For example, when the voltage input to the gate of the first inverter transistor TI1 increases, the inverter bias current IBV may increase. The first inverter transistor TI1 may be an N-type transistor or a P-type transistor.

A gate of the first inverter transistor TI1 may be connected to an inverter bias generation circuit IBG. The inverter unit IV may be connected to the inverter bias generation circuit IBG through the inverter bias node NI.

The inverter bias generation circuit IBG may determine the voltage level of an inverter bias control voltage VCI for controlling the current level of the inverter bias current IBV based on the voltage level of the power supply voltage VDD, and provide an inverter bias control voltage VCI to the inverter unit IV. Specifically, the inverter bias control voltage VCI may be applied to the gate of the first inverter transistor TI1. The resistance value of the first inverter transistor TI1 may be changed in real time according to the voltage level of the power supply voltage VDD.

An inverter bias supply voltage VDD" may be applied to the inverter bias generation circuit IBG. The inverter bias generation circuit IBG may generate the inverter bias control voltage VCI using the inverter bias supply voltage VDD". The inverter bias generation circuit IBG may divide the inverter bias supply voltage VDD" to generate the inverter bias control voltage VCI. The inverter bias supply voltage VDD" may be the same as or different from the bias supply voltage VDD'. The voltage level of the inverter bias supply voltage VDD" may be the same as or different from the voltage level of the power supply voltage VDD. For example, the voltage level of the bias supply voltage VDD' may be greater than the voltage level of the power supply voltage VDD. The inverter bias supply voltage VDD" may be varied to control the inverter bias current IBV.

The inverter bias generation circuit IBG may include a first inverter resistor R11 and a first inverter transistor T11. The first inverter resistor R11 may have the same characteristics as the first resistor R1 of the bias generation circuit BG1, and the first inverter transistor T11 may have the same characteristics as the first transistor T1 of the bias generation circuit BG1. One end of the first inverter resistor R11 may be connected to the inverter bias node NI, and an inverter bias supply voltage VDD" may be applied to the other end of the first inverter resistor R11.

The first inverter transistor T11 may be connected in series with the first inverter resistor R11. One end of the first inverter transistor T11 may be connected to the first inverter resistor R11, and a ground voltage may be applied to the other end. Thus, the first inverter resistor R11 and the first inverter transistor T11 may share the inverter bias node NI.

A power supply voltage VDD may be applied to the gate of the first inverter transistor T11. The power supply voltage VDD applied to the first inverter transistor T11 may have the same voltage level as the power supply voltage VDD applied to the first inverter I1. As the voltage level of the power supply voltage VDD applied to the gate of the first inverter transistor T11 increases, the resistance value RT1 of the first inverter transistor T11 may decrease. By applying the power supply voltage VDD to the gate of the first inverter transistor T11, the voltage level of the inverter bias control voltage VCI may be controlled based on the voltage level of the power supply voltage VDD. Accordingly, the current level of the inverter bias current IBV may be controlled.

The inverter bias generation circuit IBG may be implemented in various ways like the bias generation circuits BG1 to BG3 above. Like the second transistor T2 and the third transistor T3 shown in FIGS. 8 and 9, the inverter bias generation circuit IBG may further include a second inverter transistor and a third inverter transistor connected in series with the first inverter transistor T11. The second inverter transistor may have the same characteristics as the second transistor T2 illustrated in FIG. 7, and the third inverter transistor may have the same characteristics as the third transistor T3 illustrated in FIG. 8. An inverter bias generation circuit IBG including at least one of the second inverter transistor and the third inverter transistor may be implemented. In other words, according to various example embodiments, an inverter bias generation circuit IBG including a first inverter transistor T11 and a second inverter transistor connected in series with the inverter transistor T11 or an inverter bias generation circuit IBG including a first inverter transistor T11 and a third inverter transistor connected in series with the inverter transistor T11 may be implemented.

In another example embodiment, an inverter bias generation circuit IBG including a first inverter transistor T11, a second inverter transistor connected in series with the inverter transistor T11, and a third inverter transistor connected in series with the second inverter transistor may be implemented.

In another example embodiment, the inverter unit IV may include a plurality of inverters and a plurality of inverter transistors. The plurality of inverters may correspond to the plurality of inverter transistors, respectively. At least one of the plurality of inverter transistors may be connected to the inverter bias generation circuit IBG. For example, all of the plurality of inverter transistors or only some of the plurality of inverter transistors may be connected to the inverter bias node NI of the inverter bias generation circuit IBG.

In another example embodiment, the interface circuit 7 may include a plurality of inverter bias generation circuits IBG corresponding to the plurality of inverter transistors, respectively. In this case, each of the plurality of inverter transistors may be connected to a different inverter bias generation circuit IBG.

In another example embodiment, some of the plurality of inverter transistors are connected to the same inverter bias generation circuit IBG, and some may be connected to another inverter bias generation circuit IBG.

In the example embodiment of FIG. 12, the interface circuit 7 further includes an inverter bias generation circuit IBG, so that the interface circuit 7 may stably control the operation of the inverter unit IV, and compensate for the delay time due to the characteristics of the inverter unit IV with respect to the final output signal FOUT having the delay time. Accordingly, because the final output signal FOUT may have a constant delay time, the sensing characteristic of the interface circuit 7 may be improved.

Figure 13:
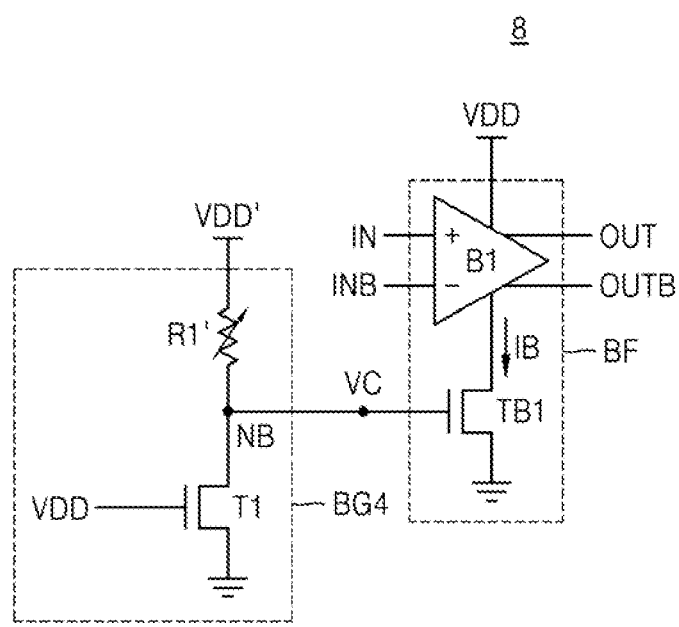
FIG. 13 is a circuit diagram of an interface circuit according to an example embodiment.

FIG. 13 is a circuit diagram of an interface circuit according to an example embodiment. Specifically, FIG. 13 provides for control of a bias control voltage VC as another example embodiment of FIG. 2.

The buffer circuit BF shown in FIG. 13 may further include the above-described various configurations.

Referring to FIG. 13, a bias generation circuit BG4 of an interface circuit 8 may include a first variable resistor R1' and a first transistor T1.

One end of the first variable resistor R1' may be connected in series with the first transistor T1, and a bias supply voltage VDD' may be applied to the other end. The resistance value of the first variable resistor R1' may vary according to the voltage level of the power supply voltage VDD. The resistance value of the first variable resistor R1' may vary so that the delay time of the output signal OUT is constant. For example, when the delay time of the output signal OUT is increased by the first time, the resistance value of the first variable resistor R1' may be decreased. When the resistance value of the first variable resistor R1' decreases, the voltage level of the bias control voltage VC increases, thereby reducing the delay time of the output signal OUT by the second time period. The resistance value of the first variable resistor R1' may vary until the second time period is equal to the first time period. When the second time period is the same as the first time period, the output signal OUT having a constant delay time may be provided.

In the present example embodiment, because the bias control voltage VC may be finely adjusted by varying the first variable resistor R1', the output signal OUT may be stably provided and a time margin of the output signal OUT may be secured.

In an example embodiment, the resistance value of the first variable resistor R1' may be changed in real time according to the voltage level of the power supply voltage VDD. The resistance value of the first variable resistor R1' may be automatically changed so that the delay time of the output signal OUT is constant. In this case, the bias generation circuit BG1 may further include a separate circuit that measures the delay time of the output signal OUT and feeds the delay time back to the bias generation circuit BG1.

Figure 14:
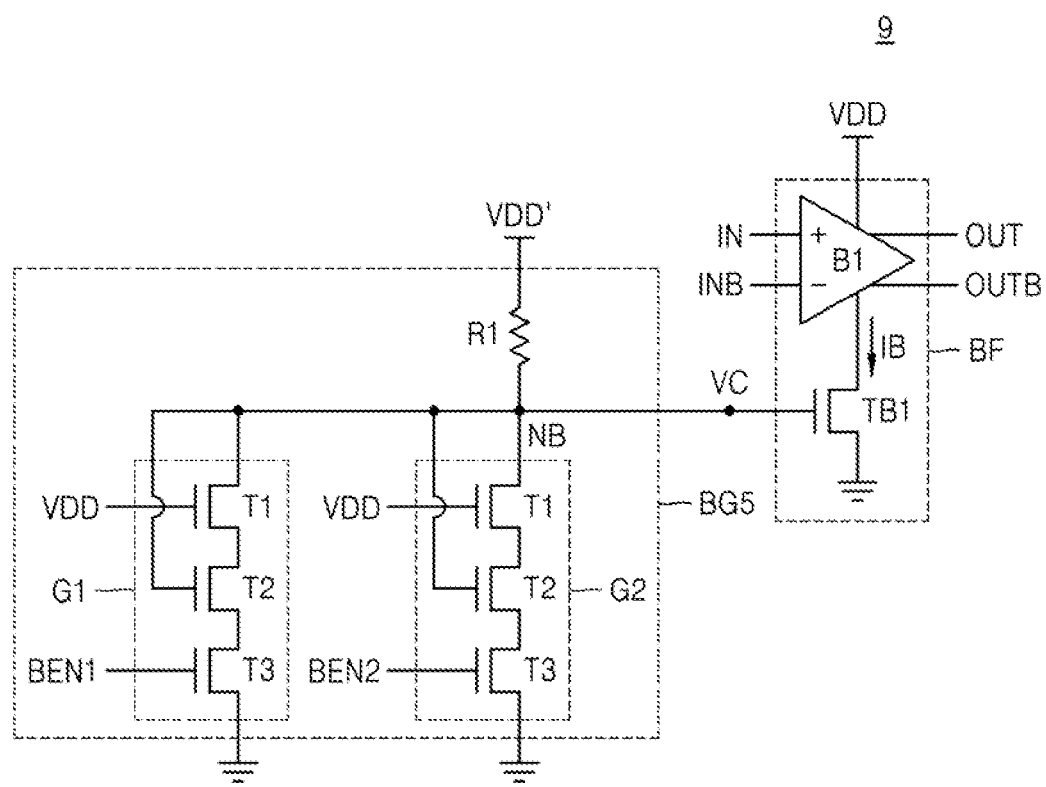
FIG. 14 is a circuit diagram of an interface circuit according to an example embodiment.

FIG. 14 is a circuit diagram of an interface circuit according to an example embodiment. Specifically, FIG. 14 provides for control of a bias control voltage VC as another example embodiment of FIG. 2.

The buffer circuit BF shown in FIG. 14 may further include the above-described various configurations.

Referring to FIG. 14, a bias generation circuit BG5 of an interface circuit 9 may include a first transistor group G1 and a second transistor group G2. The first transistor group G1 and the second transistor group G2 may be connected in parallel to each other, and each may be connected in series with the first resistor R1. Thus, the first transistor group G1, the second transistor group G2, and the first resistor R1 may share the bias node NB.

Each of the first transistor group G1 and the second transistor group G2 may include a first transistor T1, a second transistor T2, and a third transistor T3. The first transistor T1, the second transistor T2, and the third transistor T3 may have the same characteristics as the first transistor T1, the second transistor T2, and the third transistor T3 described above with reference to FIGS. 2 to 8.

A first bias enable signal BEN1 may be applied to the third transistor T3 of the first transistor group G1, and a second bias enable signal BEN2 may be applied to the third transistor T3 of the second transistor group G2. The first transistor group G1 or the second transistor group G2 may be used according to the first bias enable signal BEN1 and the second bias enable signal BEN2. For example, when the first bias enable signal BEN1 is at a high level and the second bias enable signal BEN2 is at a low level, the bias supply voltage VDD' may be divided using the first transistor group G1 and the second transistor group G2 may not be used.

The bias control voltage VC may be adjusted using the first transistor group G1 and the second transistor group G2. The first bias enable signal BEN1 and the second bias enable signal BEN2 may be applied differently according to the voltage level of the power supply voltage VDD. The first bias enable signal BEN1 and the second bias enable signal BEN2 may vary so that the delay time of the output signal OUT is constant. For example, when the first bias enable signal BEN1 and the second bias enable signal BEN2 are high-level signals, all transistors connected to the first transistor group G1 and the second transistor group G2 may be turned on. Accordingly, since the resistance value that determines the bias control voltage VC becomes small, the voltage level of the bias control voltage VC may decrease.

The present example embodiment illustrates the first transistor group G1 and the second transistor group G2, but the bias generation circuit BG3 may include a plurality of transistor groups. In the case of including a plurality of transistor groups, each of the plurality of transistor groups may turn on the transistors using the third transistor T3 included therein.

In the present example embodiment, the bias generation circuit BG1 uses a plurality of transistor groups to vary the resistance value determining the bias control voltage VC, thereby compensating for the delay time of the output signal OUT to be constant. Thereafter, the bias control voltage VC may be finely adjusted by varying the first resistor R1, the output signal OUT may be stably provided, and a time margin of the output signal OUT may be secured.

In the present example embodiment, the first resistor is illustrated as a resistor having a fixed resistance value, but a variable resistor may be used as shown in FIG. 13. In addition, as shown in FIG. 12, an inverter unit IV and an inverter bias generation circuit IBG may be further included, and as described above, the inverter bias generation circuit IBG may be implemented to include a plurality of transistor groups.

Figure 15:
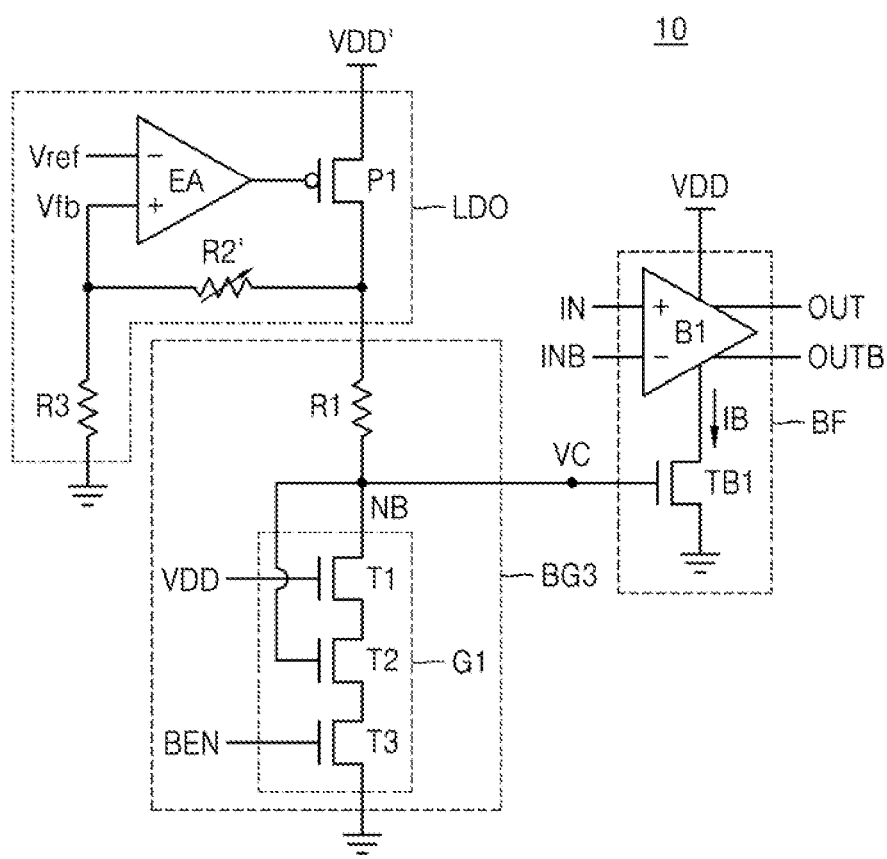
FIG. 15 is a circuit diagram of an interface circuit according to an example embodiment.

FIG. 15 is a circuit diagram of an interface circuit according to an example embodiment. Specifically, FIG. 15 provides for control of a bias control voltage VC as another example embodiment of FIG. 9.

In FIG. 15, the bias generation circuit BG3 and the buffer circuit BF may further include the various components described above.

Referring to FIG. 15, an interface circuit 10 may include an LDO circuit LDO including a variable resistor R2'. Thus, the second resistor R2 of the LDO circuit LDO of FIG. 9 may be implemented as a variable resistor R2'.

By varying the resistance value using the variable resistor R2', the voltage level of the voltage applied to the first resistor R1 may be varied. By varying the voltage level of the voltage divided in the bias generation circuit BG3, the voltage level of the bias control voltage VC provided to the buffer circuit BF may be adjusted. By adjusting the bias control voltage VC, the delay time of the output signal OUT may be uniformly controlled, and the sensing characteristic of the interface circuit 10 may be improved.

In another example embodiment, the bias control voltage VC may be controlled by changing the reference voltage Vref of the LDO circuit LDO.

In another example embodiment, the bias control voltage VC may be adjusted using the variable resistor R2' while changing the reference voltage Vref of the LDO circuit LDO.

Figure 16:
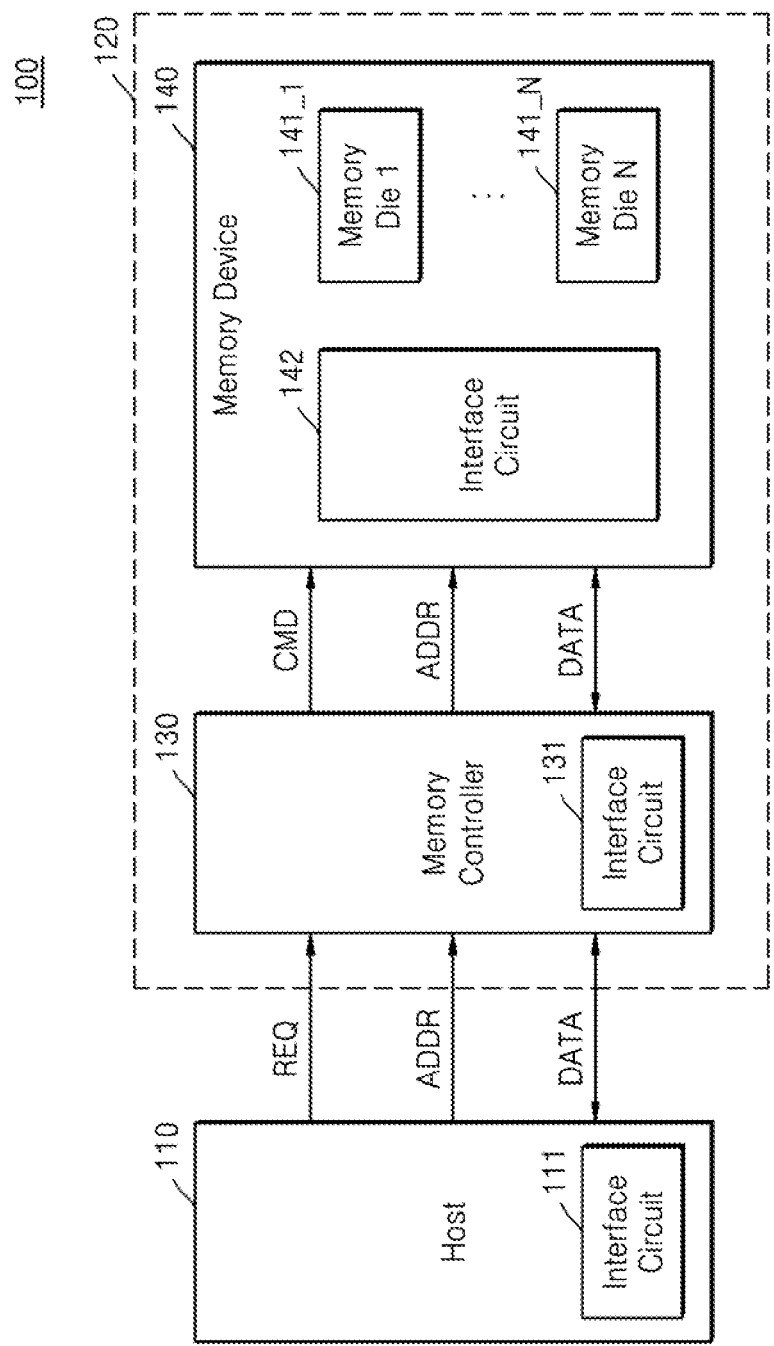
FIG. 16 illustrates a data processing system according to an example embodiment.

FIG. 16 illustrates a data processing system 100 according to an example embodiment. Specifically, the data processing system 100 may include the interface circuits 1 to 10 described above.

The data processing system 100 may include a host 110 and a memory system 120. The memory system 120 may include a memory controller 130 and a memory device 140.

The data processing system 100 may be applied to one of a variety of computing systems such as Ultra Mobile PCs (UMPCs), workstations, net books, Personal Digital Assistants (PDAs), portable computers, web tablets, wireless phones, mobile phones, smart phones, e-books, portable multimedia players (PMPs), portable game consoles, navigation devices, black boxes, digital cameras, and the like.

Each of the host 110, the memory controller 130, and the memory device 140 may be provided as one chip, one package, or one module, or for example, the memory controller 130 may be provided as the memory system 120 or the storage device together with the memory device 140.

The memory system 120 may constitute a PC card, a compact flash card (CF), a smart media card (SM/SMC), a memory stick, a multimedia card (e.g., MMC, RS-MMC, and MMCmicro), an SD card (e.g., SD, miniSD, and microSD), a universal flash storage device (UFS), and the like. As another example, the memory system 120 may constitute a solid state disk/drive (SSD).

The host 110 may include an interface circuit 111. The interface circuit 111 may include the interface circuits 1 to 10 described above with reference to FIGS. 2 to 15. The interface circuit 111 may buffer at least one signal input or output from the host 110. The interface circuit 111 may be referred to as a buffer chip or a buffer circuit. The buffer chip may be configured to buffer signals input from the outside of the host 110.

The host 110 may transmit a data operation request REQ and an address ADDR to the memory controller 130 through the interface circuit 111, and may exchange data DATA with the memory controller 130. For example, the host 110 may exchange data DATA with the memory controller 130 based on at least one of various interface protocols such as Universal Serial Bus (USB) protocol, Multi Media Card (MMC) protocol, Peripheral Component Interconnection (PCI) protocol, PCI-Express (PCI-E) protocol, Advanced Technology Attachment (ATA) protocol, Serial-ATA protocol, Parallel-ATA protocols, Small Computer Small Interface (SCSI) protocol, Enhanced Small Disk Interface (ESD) protocol, Integrated Drive Electronics (IDE) protocol, Mobile Industry Processor Interface (MIPI) protocol, Universal Flash Storage (UFS) protocol, and the like.

The memory controller 130 may include an interface circuit 131. The interface circuit 131 may include the interface circuits 1 to 10 described above with reference to FIGS. 2 to 15. The interface circuit 131 may buffer at least one signal input or output from the memory controller 130.

The memory controller 130 may control the memory device 140 through the interface circuit 131. For example, in response to a data operation request REQ received from the host 110 through the interface circuit 131, the memory controller 130 may control the memory device 140 to read data DATA stored in the memory device 140 or write data DATA to the memory device 140. For example, the memory controller 130 may control a write operation, a read operation, and an erase operation of the memory device 140 by providing an address ADDR, a command CMD, and a control signal to the memory device 140. Also, data DATA for the above operations may be transmitted/received between the memory controller 130 and the memory device 140 through the interface circuit 131. In an example embodiment, the memory controller 130 may provide a read enable signal to the memory device 140 through the interface circuit 131.

The memory device 140 may include at least one memory die, and for example, the memory device 140 may include a plurality of memory dies. For example, the memory device 140 may include a first memory die 141_1 to an N-th memory die 141_N (where N is a natural number equal to or greater than 2). Each of the first memory die 141_1 to the N-th memory die 141_N may include at least one memory cell array. The memory cell array may include a plurality of memory cells disposed in an area where a plurality of word lines and a plurality of bit lines intersect, and the plurality of memory cells may be volatile memory cells or non-volatile memory cells. Each memory cell may be a multi-level cell that stores two or more bits of data. In other implementations, some memory cells may be single-level cells (SLCs) storing 1-bit data, and some other memory cells may be multi-level cells. The memory device 140 may include a DRAM, a NAND flash memory, a vertical NAND flash memory (VNAND), a NOR flash memory, a resistive random access memory (RRAIVI), a Phase-Change Random Access Memory (PRAM), a Magnetoresistive Random Access Memory (MRAM), a Ferroelectric Random Access Memory (FRAM), a Spin Transfer Torque Random Access Memory (STT-RAM) and the like, and may include a combination thereof.

The memory device 140 may perform operations such as a write operation, a read operation, and an erase operation of the data DATA in response to signals received from the memory controller 130 through the interface circuit 142. The memory device 140 may provide a data signal generated based on the read enable signal to the memory controller 130 through the interface circuit 142.

The memory device 140 may include an interface circuit 142. The interface circuit 142 may include the interface circuits 1 to 10 described above with reference to FIGS. 2 to 15. The interface circuit 142 may buffer at least one signal input from the outside of the memory device 140. For example, the interface circuit 142 may store a command CMD provided from the memory controller 130 and/or a data operation control signal generated based on the command CMD. The interface circuit 142 may be referred to as a buffer chip or a buffer circuit. Here, the buffer chip may be configured to buffer signals input from the outside of the memory device 140.

The interface circuit 142 may include a plurality of registers. The plurality of registers may store command information for the plurality of memory dies. The command information may include a command CMD and/or a data operation control signal generated inside the memory device 140 based on the command CMD. The data operation control signal may include control signals used for data operations such as a write operation, a read operation, and an erase operation of the memory device 140. The interface circuit 142 may include, for example, a first register to an N-th register, and the first register may store command information corresponding to the first memory die 141_1, and the N-th register may store command information corresponding to the N-th memory die 141_N.

Figure 17:
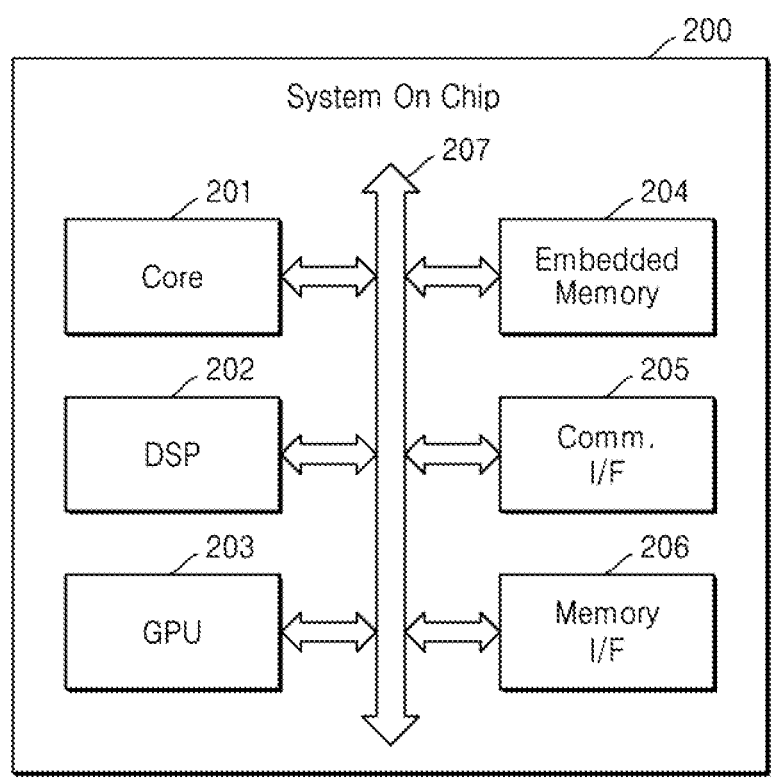
FIG. 17 is a block diagram illustrating a system-on-chip according to an embodiment.

FIG. 17 is a block diagram illustrating a system-on-chip according to an embodiment. Specifically, the System on Chip (SoC) 200 is a semiconductor device and may include an integrated circuit according to an example embodiment.

The SoC 200 implements complex functional blocks such as intellectual property (IP) that perform various functions in one chip, and active areas, standard cells, and power rails may be included in each functional block of the SoC 200. The SoC 200 may refer to an integrated circuit in which components of a computing system or other electronic system are integrated.

Referring to FIG. 17, the SoC 200 may include a core 201, a digital signal processor (DSP) 202, a graphic processing unit (GPU) 203, an embedded memory 204, a communication interface 205, and a memory interface 206. Components of SoC 200 may communicate with each other through a bus 207.

The core 201 may process commands and control operations of components included in the SoC 200. For example, the core 201 may drive an operating system and execute applications on the operating system by processing a series of commands.

The DSP 202 may process a digital signal, such as a digital signal provided from communication interface 205, to generate data.

The GPU 103 may generate data for an image output through the display device from image data provided from the embedded memory 204 or the memory interface 206, and may encode the image data.

The embedded memory 204 may store data that is used for the core 201, the DSP 202, and the GPU 103 to operate.

The communication interface 205 may provide an interface for a communication network or one-to-one communication.

The memory interface 206 may provide an interface to an external memory of the SoC 200, for example, a dynamic random access memory (DRAM), a flash memory, or the like.

At least one of the communication interface 205 and the memory interface 206 may include the above-described interface circuits 1 to 10.

By way of summation and review, as the degree of integration of semiconductor integrated circuits increases, a number of devices per unit area of a semiconductor die implementing a semiconductor integrated circuit increases. As a clock signal is transmitted to the devices, more noise may be generated in the clock signal. For example, the clock signal transmitted to the devices may have more jitter. As the speed of the clock generation circuits that generate various clock signals in the semiconductor device increases, jitter characteristics become more important. To reduce jitter, power noise of an operating voltage may be reduced.

As described above, embodiments relate to an interface circuit compensating for supply voltage variations of an analog buffer and an operating method thereof. Embodiments may provide an interface circuit capable of improving noise of an analog buffer by improving power supply induced jitter (PSIJ) due to a change in a power supply voltage, and an operating method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An interface circuit, comprising:
a buffer circuit configured to receive an input signal and to generate an output signal having a delay time, the delay time being determined based on a current level of a bias current and a voltage level of a power supply voltage; and
a bias generation circuit configured to vary a voltage level of a bias control voltage so that the delay time is constant by compensating for a change in the voltage level of the power supply voltage, the bias generation circuit being further configured to provide the bias control voltage to the buffer circuit wherein:
the bias generation circuit is configured to divide a bias supply voltage based on a resistor and a first transistor that is connected in series with the resistor, the first transistor having a gate to which the power supply voltage is applied, and
the bias control voltage is determined based on the bias supply voltage divided to the first transistor.

2. The interface circuit of claim 1, wherein the bias generation circuit further includes a second transistor that is connected in series with the first transistor, the second transistor having a gate to which the bias control voltage is applied.

3. The interface circuit of claim 1, wherein the bias generation circuit further includes a third transistor that is connected in series with the first transistor, the third transistor receiving a bias enable signal at a gate thereof to control an operation of the bias generation circuit.

4. The interface circuit of claim 1, wherein the resistor includes a variable resistor.

5. The interface circuit of claim 1, further comprising a low dropout (LDO) circuit configured to constantly provide the bias supply voltage to the bias generation circuit.

6. The interface circuit of claim 5, wherein:
the LDO circuit includes:
an error amplifier to which a reference voltage is applied;
a pass transistor having a gate to which an output of the error amplifier is applied, the pass transistor having a source terminal to which the bias supply voltage is input;
a first resistor having one end connected to a drain terminal of the pass transistor and another end connected to a feedback terminal for supplying a feedback voltage to the error amplifier; and
a second resistor connected between the feedback terminal and ground, and
the first resistor includes a variable resistor.

7. The interface circuit of claim 5, wherein:
the LDO circuit includes:
an error amplifier to which a reference voltage is applied;
a pass transistor having a gate to which an output of the error amplifier is applied, the pass transistor having a source terminal to which the bias supply voltage is applied;

a first resistor having one end connected to a drain terminal of the pass transistor and another end connected to a feedback terminal for supplying a feedback voltage to the error amplifier; and
a second resistor connected between the feedback voltage and ground, and the reference voltage is variable.

8. The interface circuit of claim 1, wherein the buffer circuit includes:
a buffer configured to receive the input signal and generate the output signal; and
a buffer transistor configured to receive the bias control voltage from the bias generation circuit, and to provide the bias current to the buffer.

9. A semiconductor device, comprising:
a buffer circuit configured to receive an input signal and to generate an output signal having a delay time, the delay time of the output signal being determined based on a current level of a bias current and a voltage level of a power supply voltage; and
a bias generation circuit including a first resistor and a first transistor group that is connected in series with the first resistor, and configured to divide a bias supply voltage based on the first transistor group to determine a voltage level of a bias control voltage that controls the current level of the bias current, the bias generation circuit being further configured to provide the bias control voltage to the buffer circuit,
wherein the first transistor group includes:
a first transistor that is connected in series with the first resistor, the first transistor having a gate to which the power supply voltage is applied;
a second transistor that is connected in series with the first transistor, the second transistor having a gate to which the bias control voltage is applied; and
a third transistor that is connected in series with the second transistor, the third transistor configured to receive a bias enable signal.

10. The semiconductor device of claim 9, wherein the first resistor includes a variable resistor.

11. The semiconductor device of claim 9, wherein the bias generation circuit further includes a second transistor group that is connected in series with the first resistor, and connected in parallel with the first transistor group, the second transistor group including another first transistor, another second transistor, and another third transistor.

12. The semiconductor device of claim 9, further comprising:
an error amplifier to which a reference voltage is applied;
a pass transistor configured to receive an output signal of the error amplifier through a gate of the pass transistor, the pass transistor having one end connected to the first resistor, and having another end to which the bias supply voltage is applied;
a second resistor having one end connected to a node between the pass transistor and the first resistor and another end connected to a feedback terminal for supplying a feedback voltage to the error amplifier; and
a third resistor having one end connected to the feedback terminal and another end to which a ground voltage is applied.

13. The semiconductor device of claim 12, wherein the second resistor includes a variable resistor.

14. The semiconductor device of claim 9, further comprising:

an inverter configured to receive the output signal and generate a final output signal having a delay time, the delay time of the final output signal being determined based on a current level of an inverter bias current and the voltage level of the power supply voltage;
an inverter transistor configured to provide the inverter bias current to the inverter; and
an inverter bias generation circuit configured to determine a voltage level of an inverter bias control voltage for controlling the current level of the inverter bias current based on the voltage level of the power supply voltage, and to provide the inverter bias control voltage to the inverter transistor.

15. The semiconductor device of claim 14, wherein the inverter bias generation circuit is configured to include the first resistor and the first transistor group.

16. A semiconductor device, comprising:
a buffer circuit configured to receive an input signal and to generate an output signal having a delay time, the delay time of the output signal being determined based on a current level of a bias current and a voltage level of a power supply voltage, the buffer circuit including a plurality of buffers and a plurality of buffer transistors; and
a bias generation circuit configured to determine a voltage level of a bias control voltage for controlling the current level of the bias current based on the voltage level of the power supply voltage, and to provide the bias control voltage to the buffer circuit,
wherein the bias generation circuit includes a variable resistor and a first transistor group that is connected in series with the variable resistor;
wherein the first transistor group includes:
a first transistor that is connected in series with the variable resistor, the first transistor having a gate to which the power supply voltage is applied;
a second transistor that is connected in series with the first transistor, the second transistor having a gate to which the bias control voltage is applied; and
a third transistor that is connected in series with the second transistor, the third transistor being configured to receive a bias enable signal through a gate of the third transistor.

17. The semiconductor device of claim 16, wherein at least one of the plurality of buffer transistors has a gate connected to a node between the variable resistor and the first transistor group.

18. The semiconductor device of claim 16, further comprising:
an inverter unit configured to receive the output signal and to generate a final output signal having a delay time, the delay time of the final output signal being determined based on a current level of an inverter bias current and the voltage level of the power supply voltage, the inverter unit including a plurality of inverters and a plurality of inverter transistors; and
an inverter bias generation circuit configured to determine a voltage level of an inverter bias control voltage for controlling the current level of the inverter bias current based on the voltage level of the power supply voltage, and to provide the inverter bias control voltage to the inverter unit, the inverter bias generation circuit including another variable resistor and another first transistor group.

* * * * *